(12) United States Patent
Po' et al.

(10) Patent No.: US 8,680,231 B2
(45) Date of Patent: Mar. 25, 2014

(54) π-CONJUGATED LOW-BAND-GAP COPOLYMERS CONTAINING BENZOTRIAZOLE UNITS

(75) Inventors: Riccardo Po', Novara (IT); Andrea Pellegrino, Trecate(Novara) (IT); Giuliana Schimperna, Novara (IT); Maria Caldararo, Trecate(Novara) (IT)

(73) Assignee: ENI S.p.A., Rome (IT)

( * ) Notice: Subject to any disclaimer, the term of this patent is extended or adjusted under 35 U.S.C. 154(b) by 132 days.

(21) Appl. No.: 13/125,402

(22) PCT Filed: Oct. 16, 2009

(86) PCT No.: PCT/EP2009/007581
§ 371 (c)(1),
(2), (4) Date: Jul. 5, 2011

(87) PCT Pub. No.: WO2010/046114
PCT Pub. Date: Apr. 29, 2010

(65) Prior Publication Data
US 2011/0319573 A1 Dec. 29, 2011

(30) Foreign Application Priority Data
Oct. 22, 2008 (IT) .............................. MI2008A1869

(51) Int. Cl.
C08G 79/08 (2006.01)
C08G 73/00 (2006.01)

(52) U.S. Cl.
USPC ............................................ 528/423; 528/8

(58) Field of Classification Search
USPC ..................................................... 528/8, 423
See application file for complete search history.

(56) References Cited

U.S. PATENT DOCUMENTS

| | | | |
|---|---|---|---|
| 6,861,502 B1* | 3/2005 | Towns et al. .................. 528/422 |
| 6,956,095 B2* | 10/2005 | Treacher et al. .................. 528/8 |
| 7,368,510 B2* | 5/2008 | Lee et al. ...................... 525/355 |
| 8,142,686 B2* | 3/2012 | Hsu et al. ...................... 252/500 |
| 8,221,906 B2* | 7/2012 | Schafer et al. ................. 428/690 |
| 8,324,400 B2* | 12/2012 | Toppare et al. ............... 548/257 |
| 2003/0186079 A1* | 10/2003 | Towns et al. .................. 428/690 |
| 2004/0115473 A1 | 6/2004 | Burroughes et al. |
| 2005/0119491 A1* | 6/2005 | Iraqi et al. ..................... 548/444 |
| 2005/0175856 A1* | 8/2005 | Rogers et al. ................. 428/690 |
| 2006/0083945 A1 | 4/2006 | Morishita et al. |
| 2007/0003783 A1 | 1/2007 | Morishita et al. |
| 2007/0043204 A1 | 2/2007 | Rogers et al. |
| 2007/0173633 A1* | 7/2007 | Son et al. ...................... 528/423 |
| 2007/0235723 A1* | 10/2007 | Li et al. ........................... 257/40 |
| 2009/0012190 A1* | 1/2009 | Klaehn et al. .................. 521/25 |
| 2009/0036623 A1* | 2/2009 | Tsuda et al. .................. 526/242 |
| 2009/0048413 A1* | 2/2009 | Oda et al. .......................... 528/7 |
| 2010/0041861 A1* | 2/2010 | Li ................................. 528/367 |
| 2010/0073603 A1* | 3/2010 | Akino ............................. 349/69 |
| 2010/0249367 A1* | 9/2010 | Toppare et al. ................ 528/380 |
| 2012/0083583 A1* | 4/2012 | Toppare et al. ................ 528/380 |
| 2012/0156829 A1* | 6/2012 | Chen et al. ...................... 438/99 |
| 2012/0326140 A1* | 12/2012 | Fukushima et al. ............ 257/40 |
| 2013/0001474 A1* | 1/2013 | Caldararo et al. ............. 252/500 |

FOREIGN PATENT DOCUMENTS

WO 2004 099285 11/2004
WO 2006 041221 4/2006

OTHER PUBLICATIONS

Huang et al. Chem. Mater. 2004, 16, 708-716.*
International Search Report issued Jun. 21, 2010 in PCT/EP09/007581 filed Oct. 16, 2009.

* cited by examiner

*Primary Examiner* — Liam Heincer
(74) *Attorney, Agent, or Firm* — Oblon, Spivak, McClelland, Maier & Neustadt, L.L.P.

(57) ABSTRACT

The present invention relates to an alternating or statistical conjugated copolymer comprising: at least one benzotriazole unit B having general formula (Ia) or (Ib): wherein the group R is selected from alkyl, aryl, acyl or thioacyl groups, possibly substituted; at least one conjugated structural unit A, wherein each unit B is connected with at least one unit A in any of the positions 4, 5, 6 or 7, preferably in positions 4 or 7.

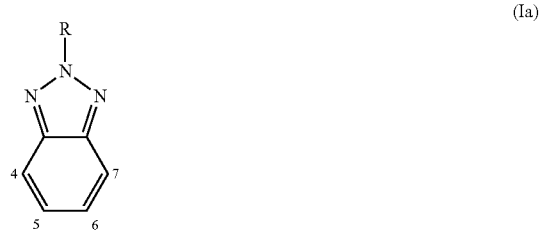

(Ia)

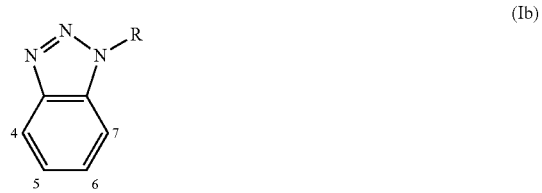

(Ib)

4 Claims, No Drawings

π-CONJUGATED LOW-BAND-GAP COPOLYMERS CONTAINING BENZOTRIAZOLE UNITS

The present invention relates to conjugated low-band-gap copolymers and the relative preparation process.

The present invention falls within the field of photo-active materials which can be used in the construction of photovoltaic devices.

Photovoltaic devices are devices capable of converting the energy of a light radiation into electric energy. At present, most photovoltaic devices which can be used for practical applications exploit the physico-chemical properties of photo-active materials of the inorganic type, in particular high-purity crystalline silicon. As a result of the high production costs of silicon, scientific research has been orienting its efforts towards the development of alternative organic materials having a polymeric structure (so-called "polymer photovoltaic cells"). Unlike high-purity crystalline silicon, in fact, organic polymers are characterized by a relative synthesis facility, a low production cost, a reduced weight of the relative photovoltaic device, in addition to allowing the recycling of said polymer at the end of the life-cycle of the device in which it is used.

The functioning of polymer photovoltaic cells is based on the combined use of an electron acceptor compound and an electron donor compound. In the state of the art, the most widely-used electron donor and acceptor compounds in photovoltaic devices are π-conjugated polymers belonging to the groups of polypara-phenylene vinylenes or polythiophenes. The former can be used as both acceptor and donor compounds, on the basis of the electronic properties determined by the substituent groups of the polymer chain. The latter are normally used as donor compounds. Derivatives of fullerene are the most widely-used acceptor compounds.

The basic conversion process of light into electric current in a polymer photovoltaic cell takes place through the following steps:
1. absorption of a photon by the donor compound with the formation of an exciton, i.e. a pair of "electron-hole" charge transporters;
2. diffusion of the exciton in a region of the donor compound in which its dissociation can take place;
3. dissociation of the exciton in the two separated charge carriers (electron (−) and hole (+));
4. transporting of the carriers thus formed to the cathode (electron, through the acceptor compound) and anode (hole, through the donor compound), with the generation of an electric current in the circuit of the device.

The photo-absorption process with the formation of the exciton and subsequent transfer of the electron to the acceptor compound leads to the move of an electron from the HOMO (Highest Occupied Molecular Orbital) to the LUMO (Lowest Unoccupied Molecular Orbital) of the donor and subsequently the transfer from this to the LUMO of the acceptor.

As the efficiency of a polymer photovoltaic cell depends on the number of free electrons which are generated by dissociation of the excitons, one of the structural characteristics of the donor compounds which mostly influences said efficiency is the difference in energy existing between the HOMO and LUMO orbitals of the donor (so-called band-gap). The wavelength of the photons which the donor compound is capable of collecting and effectively converting into electric energy (so-called "photon harvesting" or "light-harvesting" process) depends, in particular, on this difference. In order to obtain acceptable electric currents, the band-gap between HOMO and LUMO must not be too high, but at the same time, it must not be too low, as an excessively low gap would decrease the voltage obtainable at the electrodes of the device.

The flow of photons of solar radiation which reaches the surface of the Earth is maximum for energy values of around 1.8 eV (corresponding to radiations having a wave-length of about 700 nm). Due to the high band-gap values, however, (generally higher than 2 eV) which characterize polymeric materials currently known and used as donor compounds in photovoltaic devices, the light harvesting process of this spectral range is not very efficient and only a fraction of the overall solar energy (generally that of 350 to 650 nm) is converted into electric energy. Among the polymers most widely-used as donor compounds, for example, the polymer MDMO-PPV (poly[2-methoxy-5-(3,7-dimethyloctyloxy)-1,4-phenylene]-alt-(vinylene)) has a band-gap equal to 2.2 eV, whereas the polymer P3HT (poly(3-hexylhtiophene) has a band-gap of 1.9 eV. These compounds, used in combination with acceptor compounds based on fullerenes, are capable to afford maximum conversion efficiencies of solar radiation equal to about 3.5%.

In order to improve the yield of the light harvesting process and consequently the efficiency of photovoltaic devices, it is consequently fundamental to find new donor compounds capable of capturing and converting solar radiations having a lower energy, i.e. donor compounds characterized by lower band-gap values than those of organic polymers typically used as donors. On the basis of what is known in literature, the group of low-band-gap polymers is defined as being that which includes structures with a band-gap (measured on thin films) ranging from 1.5 to 2.0 eV (lower band-gaps are not desirable as they cause a reduction in the cell voltage and consequently in the efficiency).

A further aspect to be improved is that relating to cell production processes. Current technologies envisage resort to solution deposition techniques of thin photo-active layers combined with high vacuum processes for the production of electrodes (or of the same photo-active layer, in the case of cells based on low-molecular-weight organic molecules). The solution deposition of polymers envisages resort to drop casting, spin coating, dip coating, spray coating, ink-jet printing, screen printing, roll-to-roll deposition processes, etc. and the use of a suitable solvent. The donor polymers are normally dissolved in organic solvents such as toluene, xylenes, chloroform, chlorobenzene, etc. to guarantee complete solubility. These solvents, however, are highly toxic and consequently in an industrial process, it is advisable to eliminate them. The use of polymers soluble in aqueous, alcoholic solvents or also in hydro-alcohol mixtures, would be extremely beneficial. In this way, in addition to the toxicity, the dangers deriving from potential explosions, due to the formation of explosive mixtures between air and vapours of organic solvent or finely divided drops of organic solvent, would be enormously reduced.

The objective of the present invention is to overcome the drawbacks of the state of the art.

An object of the present invention therefore relates to an alternating or statistical conjugated copolymer comprising:

at least one benzotriazole unit B having general formula (Ia) or (Ib):

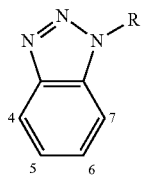

(Ib)

wherein the group R is selected from alkyl, aryl, acyl or thioacyl groups, possibly substituted;

at least one conjugated structural unit A, wherein each unit B is connected to at least one unit A in any of the positions 4, 5, 6 or 7, preferably in positions 4, 7.

The group R is preferably selected from alkyl groups, preferably branched, containing 2-32 carbon atoms, preferably 6-16 carbon atoms; or aryl groups, preferable phenyl groups, substituted with alkyl radicals, having 4-24 carbon atoms; or acyl or thioacyl groups having 4-32 carbon atoms, possibly substituted with 1-4 halogen atoms, preferably Br, Cl or F, or with a polar or ionic group preferably selected from CN, $NO_2$, OH, $NH_2$, OR", COOR", COR", CSR", CSSR", COSR", OCOR", NR"$_2$, CONR"$_2$, NCOOR", NR, $R_2R_3X$, $PR_1R_2R_3X$, $SO_3M$, $SO_3R$, COOM, wherein each R", $R_1$, $R_2$ and $R_3$ is independently a hydrocarbon group, preferably aliphatic, having 1-8 carbons atoms, each X represents an organic or inorganic monovalent counter-anion, preferably selected within the group of fluoride, chloride, bromide, iodide, tetrafluoborate, hexafluorophosphate, methylsulfate, trifluoromethanesulfonate, benzenesulfonate, p-toluenesulfonate, perchlorate, nitrate, dihydrogen phosphate, hydrogen sulphate, and each M represents an alkaline cation, preferably Na, K or an ammonium ion.

The benzotriazole unit B preferably has the general formula (Ia).

The conjugated unit A according to the present invention consists, in its most general form, of a divalent unsaturated group, capable of forming, when bound to said benzotriazole unit B or to another unit of type A in the copolymer as defined above, a conjugated bond at least partially of the type π, delocalized along the main chain of the copolymer.

The structural units A are preferably units whose main divalent structure can be traced to the species ethylene, phenylene, thiophene, pyrrole, fluorene, dithienocyclopentadiene, dithienothiophene, thienothiophene, isothianaphthalene, carbazole, thiazothiazole, optionally substituted with alkyl groups or alkyls functionalized with halogens, preferably fluoride or chloride, or ionic groups, preferably cationic, ammonium or quaternary phosphonium.

The structural units A can be selected, for example, from those of the following list:

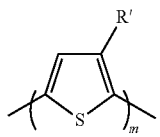

wherein m=1-6,

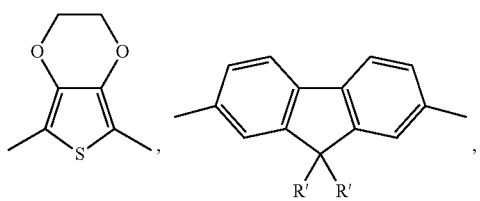

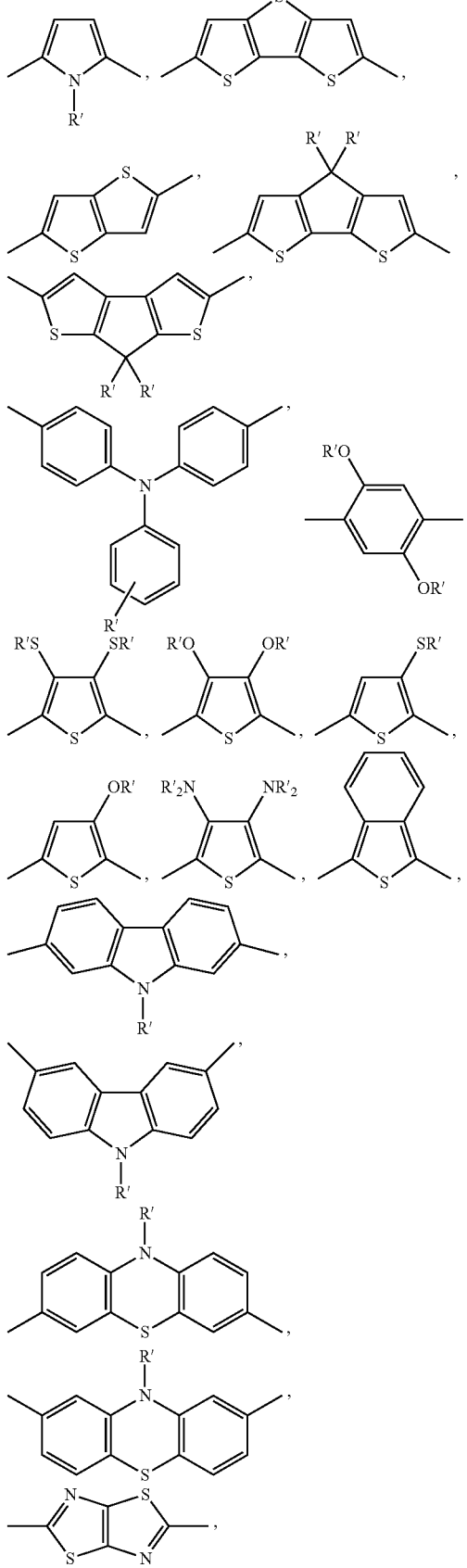

wherein each substituent indicated with R' is H, or it is selected independently from any one of the groups represented by the group R as previously defined.

The conjugated unit A preferably contains at least one phenothiazine divalent unit.

In the copolymers of the present invention of the statistical type, the unit A can also consist of a benzotriazole group having one of the above formulae (Ia) or (Ib), with the condition that the copolymer in any case also contains type A units different from benzotriazole.

In order to guarantee the solubility of the copolymers according to the present invention, the ratio between the sum of all the carbon atoms of the alkyl chains (i.e. R and R') present in the repetitive base units of the copolymer and the number of aromatic rings present in the same units is preferably within the range of 3.5-12.

The conjugated copolymers of the present invention preferably have a structure of the repetitive base unit of the alternating type $(A-B)_n$, $(A-B-A)_n$ or $(B-C-A-C)_n$, or statistical $(A-B)_v$-co-$(A-C)_z$ or $[(A-B)_v$-co-$(C-B)_z)]$, wherein A and B have the meaning previously defined, C is a further conjugated unit of the A type, n is an integer varying from 2 to 1,000, preferably from 5 to 1,000, v and z are two integers different from 0 such that the sum (v+z) is within the range of 2-1,000, preferably 5-1,000.

In the copolymers of the type $(B-C-A-C)_n$, comprising a conjugated structural unit of the type -C-A-C-, C is a divalent conjugated group of the vinylidene type, or heteroaromatic with 5 member rings, preferably thiophene or dithiophene, possibly substituted with R' groups, and A is a group comprising aromatic or heteroaromatic rings with 6 members, possibly condensed with each other or with 5 member rings, preferably phenothiazine, phenazine, carbazole, fluorine, anthracene.

In an even more preferred variant of the invention, the structure of the copolymer envisages, in the main chain, conjugated units with six member rings bonded to vinylidene conjugated units or containing only five member rings. It has been surprisingly found that this configuration guarantees a copolymer with a lower energy band-gap and consequently a greater absorption capacity of the photons of solar radiation having greater wave lengths.

In a further preferred variant of the invention, at least one of the radicals R and R' present on any of the monomeric units of A or B type, carries an ionic group, preferably a cationic group of the quaternary ammonium or phosphonic type. The existence of these particular substituents, possibly and even more preferably carrying hydroxyl groups, gives the polymer (also defined an ionic polymer) a solubility in high-polarity solvents, for example water, alcohols (such as methanol, ethanol, etc.) or mixtures thereof, which is such as to enable deposition processes under conditions which have a greater respect for the safety of people and the environment, as they do not require aromatic or halogenated hydrocarbon organic solvents.

The quaternary ammonium or phosphonium groups respectively have the general formulae (II) and (III)

$$—R_1—N(R_2R_3R_4)^+X^-\quad\quad\quad\quad\quad\quad (II)$$

$$—R_1—P(R_2R_3R_4)^+X^-\quad\quad\quad\quad\quad\quad (III)$$

wherein
i) $R_1$ is an alkylene radical, possibly branched, containing 2-12 carbon atoms, possibly also included in aromatic units (for example p-phenylene groups);
ii) $R_2$, $R_3$, $R_4$, equivalent to or different from each other, are alkyl radicals containing 1-4 carbon atoms, possibly also containing hydroxyl groups;
iii) $X^-$ is an organic or inorganic monovalent anion selected from the group of chloride, bromide, iodide, tetrafluoborate, hexafluorophosphate, methylsulfate, trifluoromethanesulfonate, benzenesulfonate, p-toluenesulfonate, perchlorate, nitrate, preferably a chloride or bromide anion.

The nitrogen atom of the ammonium ion can belong to a saturated cyclic or aromatic unit, such as for example a morpholine group (a), pyridine group (b) or imidazole group (c):

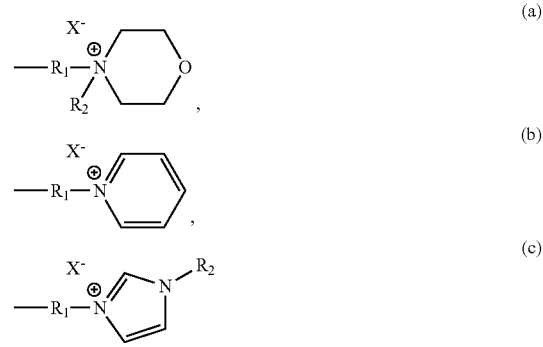

Examples of cationic groups are the following:
—$(CH_2)_n$—$N(CH_3)_3^+$,
—$(CH_2)_n$—$N(CH_2CH_3)_3^+$,
—$(CH_2)_n$—$N(CH_2CH_2OH)_3^+$,
—$(CH_2)_n$—$N(CH_3)(CH_2CH_2OCH_2CH_2)^+$, wherein N belongs to the N-methylmorpholine ring,
—$(CH_2)_n$—$N(CH_2CH_2OH)(CH_2CH_2OCH_2CH_2)^+$,
—$CH_2CH_2O$—$CH_2CH_2$—$N(CH_3)_3^+$,
—$(CH_2CH_2O)_2$—$CH_2CH_2$—$N(CH_3)_3^+$,
—$(CH_2CH_2O)_3$—$CH_2CH_2$—$N(CH_3)_3^+$,
—$(CH_2)_n$—$[NC_5H_5]^+$ (pyridine salt),
—$(CH_2)_n$—$N_2C_3H_4^+$ (imidazole salt),
—$(CH_2)_n$—$N(CH_2CH_2)CH^+$ (quinuclidine salt).

In a further preferred variant of the invention, at least one of the radicals R and R' present on any of the conjugated monomeric units, preferably on the type A monomeric units, carries a group of the anionic type.

Examples of anionic groups are the following:
—$(CH_2)_n$$COO^-Y^+$,
—$(CH_2)_n$—$SO_3^-Y^+$,
—$(CH_2)_n$—$C_6H_4SO_3^-Y^+$,
—$(CH_2)_n(P=O)O_2^-Y^+$,
—$(CH_2)_n$—$C_6H_4(P=O)O_2^-Y^+$,
wherein n is an integer varying from 1 to 12 and r is a cationic counter-ion which balances the negative charge of the anionic groups.

$Y^+$ is preferably a monovalent cation, for example $Na^+$, $K^+$ and $NH_4^+$. Although $Y^+$ can also be a divalent cation, it is preferable to counterbalance the negative charge of the anionic groups with monovalent cations to avoid problems of crosslinking of the copolymer.

The above ionic polymers (both cationic and anionic) represent a preferred group of compounds among those object of the present invention, as they are capable of generating, under suitable conditions, self-organized supramolecular structures. This capacity allows the ionic polymers to form photoactive layers having a morphology which is particularly favourable for the circulation of the electric currents generated.

Particularly preferred, in accordance with the present invention, are copolymers having a structure which envisages, in the main chain, conjugated units with six member rings bonded to vinylidene conjugated units or containing only five member rings, wherein at least a part of the R or R' substituents, present on the monomer units, preferably at least 30% with respect to the total of said substituents, is composed of a hydrocarbyl group, preferably aliphatic, having 4-24 carbon atoms, substituted with a quaternary ammonium or phosphonium group.

The conjugated copolymers of the present invention can be obtained by means of condensation reactions catalyzed by metallic complexes, such as, for example, those known in literature as Suzuki, Stille, Heck, Yamamoto reactions, or through processes of the radical or redox type, referring to those described in the examples or in any case which can be easily deduced by experts in the field on the basis of known methods of organic chemistry.

In the Suzuki reaction (adopted herein), two monomers, respectively functionalized with two bromine atoms (alternatively they can be iodine or trifluoromethanesulfonic groups) for the former, and with a —B(OH)$_2$ group, possibly esterified, for the latter, react in the presence of a Pd (0) complex (normally Pd(PPh$_3$)$_4$) and in the presence of bases (potassium carbonate or bicarbonate, or a tetra-alkylammonium hydroxide). The metal complex is oxidatively added to the aryl halide and the adduct subsequently condenses with the boron derivative. The reductive elimination causes the formation of the carbon-carbon bond and recovery of the catalytic species. The repetition of this cycle of reactions leads to the formation of the polymer.

The reaction is schematically represented as follows

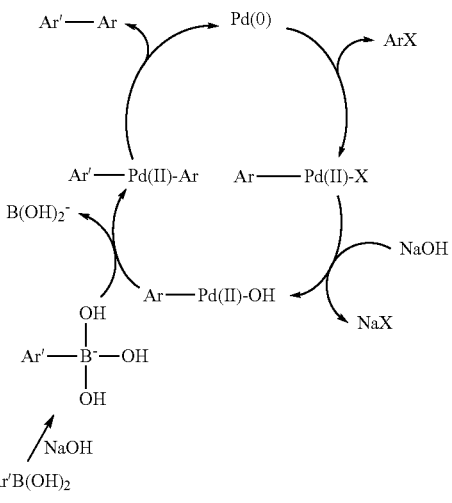

X = Br, I

The synthesis method of the polymers claimed herein, however, is not limited to the Suzuki reaction. The Stille reaction is analogous to the Suzuki reaction and comprises the coupling of monomers functionalized in the two reactive positions with a halogen (bromine) with monomers functionalized with a trialkylstannyl group. The Yamamoto reaction envisages the coupling of dihalides catalyzed by nickel (0) complexes, such as Ni(cyclooctadienyl). The catalyst can also be obtained in situ starting from nickel, zinc chloride bipyridine and triphenylphosphine. If a 1,2-vinylene group is to be introduced into the polymer, resort is made to different reactions: the Wittig reaction envisages the condensation of an aromatic dialdehyde with an arylphosphonium halide; the Knoevenagel reaction comprises an aromatic dialdehyde and an arene having weak acid hydrogens and is catalyzed by bases. The weak acid derivative undergoes a deprotonation which gives rise to a bifunctional nucleophile which attacks the dialdehyde; the elimination of the water subsequently leads to the formation of the double conjugated bond with the ring; the dehydrohalogenation of aryl dihalides takes place in the presence of strong bases (e.g. sodium hydride) and by heating the product to a high temperature to eliminate the halogenidric acid. When the dehydrohalogenation reaction is effected in the presence of an excess of potassium t-butoxide, it is called the "Gilch method"; the McMurray reaction consists in the deoxygenative coupling of aromatic dialdehydes induced by titanium in oxidation state zero; the Heck reaction envisages the condensation of aryl halides with divinylarenes, catalyzed by Pd(0) complexes.

The reaction which leads to the formation of ammonium salts is effected according to well-known methods, by reacting the polymeric precursor, represented by a polymer having bromoalkyl chains as substituents on the monomeric units with a tertiary amine in excess, and eliminating the excess amine at the end of the reaction.

The copolymers according to the present invention have favourable physico-chemical properties which allow them to be used as photo-active materials, in particular as electron-donor compounds in photovoltaic devices. For this purpose, the copolymers are generally used in the form of thin films, preferably having a thickness varying from 0.05 to 0.5 μm.

A further object of the present invention therefore relates to a solar cell comprising the above copolymers in the form of thin films.

Thanks to the low band-gap value which characterizes them, these copolymers are capable of capturing and effectively converting into electric energy, also solar radiation with a higher wave-length, unlike the donor compounds known and used in the state of the art.

A further object of the present invention therefore relates to a photovoltaic device comprising any of the copolymers of the present invention.

The photovoltaic device is preferably a solar cell.

The following embodiment examples are provided for illustrative purposes of the present invention and should not be considered as limiting its protection scope.

Method for Determining the HOMO-LUMO Band-Gap

The copolymers according to the present invention were characterized by means of UV-Vis-NIR spectroscopy to determine the energy value of the HOMO-LUMO band-gap according to the following procedure.

The polymer is dissolved in a suitable solvent, preferably selected from aromatic and/or halogenated hydrocarbons, for example chloroform, for neutral polymers and from water, alcohols and ethers, such as tetrahydrofuran or dioxane, for ionic polymers.

The solution obtained, at variable dilutions according to the polymer, is used for preparing a film of about 100 nm by spin coating. The film thus obtained is analyzed in transmission by means of a double-beam UV-Vis-NIR spectrophotometer and Perkin Elmer λ 950 double monochromator, within the range of 190-900 nm with a passthrough band of 2.0 nm, a scanning rate of 120 nm/min and step of 1 nm, using an analogous quartz carrier, as reference.

The band-gap is estimated by measuring the absorption edge corresponding to the transition from the valence band (VB) to the conduction band (CB). For determining the edge, resort was made to the intersection with the axis of the abscissa of the tangent line at the absorption band in the flexpoint.

The flexpoint ($\lambda_F$, $y_F$) is determined on the basis of the coordinates of the minimum of the spectrum in first derivative, indicated with $\lambda'_{min}$ ed $y'_{min}$.

The equation of the tangent line at the UV-Vis spectrum in the flexpoint ($\lambda_F$, $y_F$) is:

$$y = y'_{min}\lambda + y_F - y'_{min}\lambda'_{min}$$

Finally, from the intersection condition with the axis of the abscissa y=0, the following is obtained:

$$\lambda_{EDGE} = (y'_{min}\lambda'_{min} - y_F)/y'_{min}$$

Therefore, by measuring the coordinates of the minimum of the spectrum in first derivative and the corresponding absorbance value $y_F$ from the UV-Vis spectrum, $\lambda_{EDGE}$ is obtained directly by substitution.

The corresponding energy is:

$$E_{EDGE} = h\nu_{EDGE} = hC/\lambda_{EDGE}$$

wherein
h=6.626 10$^{-34}$ J s
c=2.998 10$^8$ m s$^{-1}$
i.e. $E_{EDGE}$=1.988 10$^{-16}$ J/$\lambda_{EDGE}$(nm).
Finally, remembering that 1 J=6.24 10$^{18}$ eV, the following is obtained:

$$E_{EDGE} = 1239.81 \text{ eV*nm}/\lambda_{EDGE}(\text{nm})$$

EXAMPLE 1

The Preparation of Copolymer 1

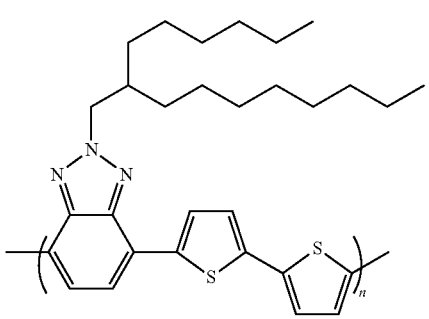
(copolymer 1)

is described hereunder.

The following products are introduced into a two-necked 250 ml flask equipped with a magnetic stirrer and reflux condenser, under an inert atmosphere:

510.5 mg (1.03 mmoles) of 4,7-dibromo-2-(2-hexyldecyl)-2H-benzotriazole,
439.5 mg (1.04 mmoles) of 2,2'-bithiophene-5,5'-pinacolyl diboronate,
2 ml of anhydrous ethanol,
1 ml of a 4M solution of $K_2CO_3$,
85 ml deaerated toluene.

The reaction mixture is heated to 90° C. for 15' and 121 mg (0.104 mmoles) of palladium (0) tetrakis(triphenylphosphine)

are subsequently added.

The reaction mixture is then heated to 100° C. and maintained at this temperature for 35 hours.

The reaction mixture is then concentrated to an eighth of its initial volume and poured into 150 ml of methanol. The solid obtained is filtered, re-dissolved in 10 ml of chloroform and re-precipitated in 150 ml of methanol. The polymer thus obtained is filtered and left to dry in an oven at 55° C. for 3 days. 354.1 mg of a black solid are obtained.

The band gap measured for copolymer 1 is equal to 1.92 eV.

EXAMPLE 2

The Preparation of Copolymer 2

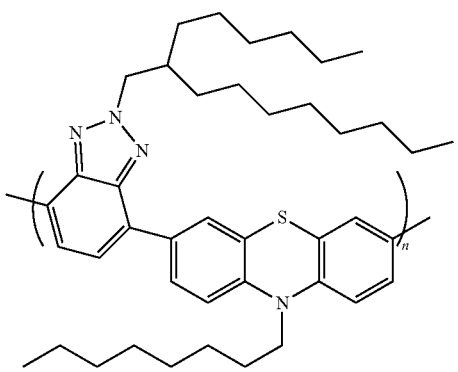
(copolymer 2)

is described hereunder.

The following products are introduced into a two-necked 250 ml flask equipped with a magnetic stirrer and reflux condenser, under an inert atmosphere:

480.8 mg (0.96 mmoles) of 4,7-dibromo-2-(2-hexyldecyl)-2H-benzotriazole,
386.9 mg (0.96 mmoles) of N-octylphenothiazine-3,7-diboronic acid,
2 ml of anhydrous ethanol,
1 ml of a 4M solution of $K_2CO_3$,
85 ml deaerated toluene.

The reaction mixture is heated to 90° C. for 15' and 100 mg (0.086 mmoles) of palladium (0) tetrakis(triphenylphosphine)

are subsequently added.

The reaction mixture is then heated to 100° C. and maintained at this temperature for 35 hours.

The reaction mixture is then concentrated to an eighth of its initial volume and poured into 150 ml of methanol. The solid obtained is filtered, re-dissolved in 10 ml of chloroform and re-precipitated in 150 ml of methanol. The polymer thus obtained is filtered and left to dry in an oven at 55° C. for 3 days. 323.4 mg of a solid are obtained.

The band gap measured for copolymer 2 is equal to 2.37 eV.

EXAMPLE 3

The Preparation of Copolymer 3

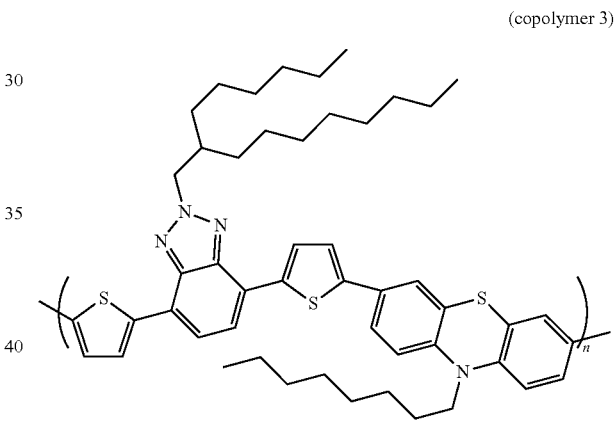
(copolymer 3)

is described hereunder.

The following products are introduced into a two-necked 250 ml flask equipped with a magnetic stirrer and reflux condenser, under an inert atmosphere:

405 mg (0.736 mmoles) of bis-4,7-(5' bromothien-2'-yl)-2-(2-ethylhexyl)-2H-benzotriazole,
377.4 mg (0.738 mmoles) of N-(2'-hexyldecyl)phenothiazine-3,7-diboronic acid,
2 ml of anhydrous ethanol,
1 ml of a 4M solution of $K_2CO_3$,
85 ml deaerated toluene.

The reaction mixture is heated to 90° C. for 15' and 85 mg (0.0735 mmoles) of palladium (0) tetrakis(triphenylphosphine)

are subsequently added.

The reaction mixture is then heated to 100° C. and maintained at this temperature for 35 hours.

The reaction mixture is then concentrated to an eighth of its initial volume and poured into 150 ml of methanol. The solid obtained is filtered, re-dissolved in 10 ml of chloroform and re-precipitated in 150 ml of methanol. The polymer thus obtained is filtered and left to dry in an oven at 55° C. for 3 days. 506 mg of a black solid are obtained.

The band gap measured for copolymer 3 is equal to 2.13 eV.

EXAMPLE 4

The Preparation of the Statistical Copolymer 4

(copolymer 4; (x/y = 2.45))

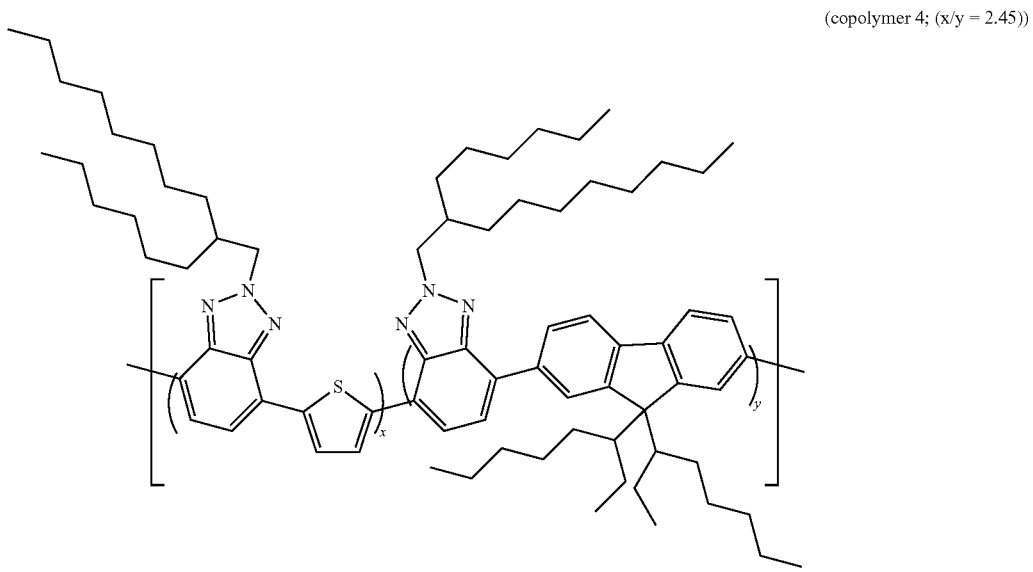

is described hereunder.

The following products are introduced into a two-necked 250 ml flask equipped with a magnetic stirrer and reflux condenser, under an inert atmosphere:
- 1.020 g (2.04 mmoles) of 4,7-dibromo-2-(2-hexyldecyl)-2H-benzotriazole,
- 180.9 mg (1.01 mmoles) of 2,5-thiophene-diboronic acid,
- 501.7 mg (1.04 mmoles) of [9,9-bis(2-ethylhexyl)-9H-fluorene]-2,7-bisboronic acid,
- 4 ml of anhydrous ethanol,
- 2 ml of a 4M solution of $K_2CO_3$,
- 85 ml deaerated toluene.

The reaction mixture is heated to 90° C. for 15' and
- 100 mg (0.086 mmoles) of palladium (0) tetrakis(triphenylphosphine)

are subsequently added.

The reaction mixture is then heated to 100° C. and maintained at this temperature for 35 hours.

The reaction mixture is then concentrated to an eighth of its initial volume and poured into 150 ml of methanol. The solid obtained is filtered, re-dissolved in 10 ml of chloroform and re-precipitated in 150 ml of methanol. The polymer thus obtained is filtered and left to dry in an oven at 55° C. for 3 days. 526.5 mg of a brown solid are obtained.

The band gap measured for copolymer 4 is equal to 2.70 eV.

EXAMPLE 5

The Preparation of the Statistical Copolymer 5

(copolymer 5; (x/y = 1.86))

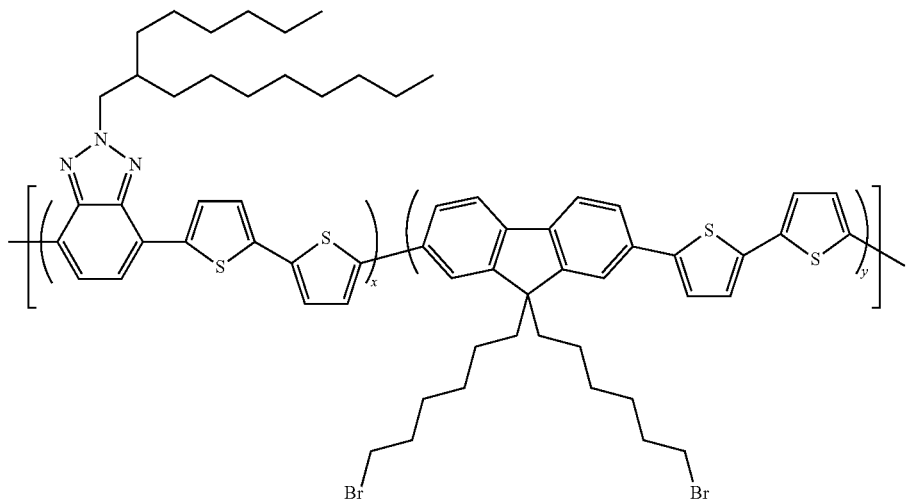

is described hereunder.

The following products are introduced into a two-necked 250 ml flask equipped with a magnetic stirrer and reflux condenser, under an inert atmosphere:
- 218.7 mg (0.438 mmoles) of 4,7-dibromo-2-(2-hexyldecyl)-2H-benzotriazole,
- 367.5 mg (0.878 mmoles) of 5,5'-bisthiophene-2,2'-diboronic acid,
- 283.6 mg (0.439 mmoles) of 2,7-dibromo-9,9-bis(6-bromohexyl)-9H-fluorene,
- 2 ml of anhydrous ethanol,
- 1 ml of a 4M solution of $K_2CO_3$,
- 85 ml deaerated toluene.

The reaction mixture is heated to 90° C. for 15' and
- 101.34 mg (0.087 mmoles) of palladium (0) tetrakis(triphenylphosphine)

are subsequently added.

The reaction mixture is then heated to 100° C. and maintained at this temperature for 35 hours.

The reaction mixture is then concentrated to an eighth of its initial volume and poured into 150 ml of methanol. The solid obtained is filtered, re-dissolved in 10 ml of chloroform and re-precipitated in 150 ml of methanol. The polymer thus obtained is filtered and left to dry in an oven at 55° C. for 3 days. 210 mg of solid product are obtained.

The band gap measured for copolymer 5 is equal to 1.99 eV.

EXAMPLE 6

The Preparation of the Statistical Copolymer 6

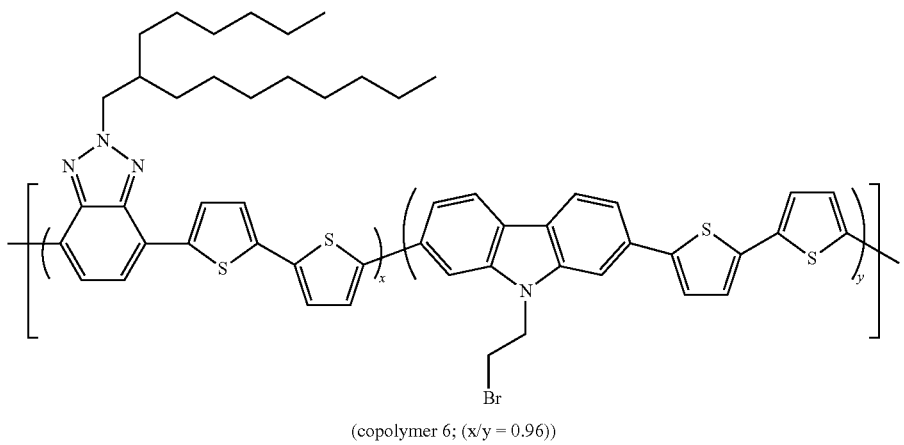

(copolymer 6; (x/y = 0.96))

is described hereunder.

The following products are introduced into a two-necked 250 ml flask equipped with a magnetic stirrer and reflux condenser, under an inert atmosphere:
- 214.7 mg (0.430 mmoles) of 4,7-dibromo-2-(2-hexyldecyl)-2H-benzotriazole,
- 183.4 mg (0.428 mmoles) of 3,6-dibromo-N-(2-bromoethyl)carbazole,
- 358.80 mg (0,858 mmoles) of 5,5'-bisthiophene-2,2'-diboronic acid,
- 2 ml of anhydrous ethanol,
- 1 ml of a 4M solution of $K_2CO_3$,
- 85 ml deaerated toluene.

The reaction mixture is heated to 90° C. for 15' and
- 99.15 mg (0.086 mmoles) of palladium (0) tetrakis(triphenylphosphine)

are subsequently added.

The reaction mixture is then heated to 100° C. and maintained at this temperature for 35 hours.

The reaction mixture is then concentrated to an eighth of its initial volume and poured into 150 ml of methanol. The solid obtained is filtered, re-dissolved in 10 ml of chloroform and re-precipitated in 150 ml of methanol. The polymer thus obtained is filtered and left to dry in an oven at 55° C. for 3 days. 353 mg of solid product are obtained.

The band gap measured for copolymer 6 is equal to 1.88 eV.

EXAMPLE 7

The Preparation of the Statistical Copolymer 7

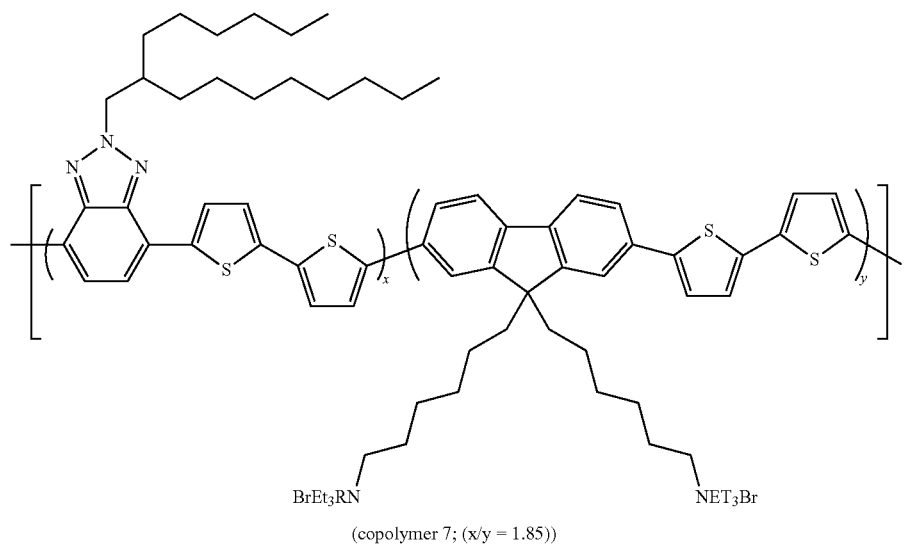

(copolymer 7; (x/y = 1.85))

is described hereunder.

200 mg of copolymer 5 are dissolved in 20 ml of THF. 1 ml of triethylamine are added to the solution. After 24 h of stirring at room temperature, the solution is concentrated to a tenth of the initial volume and precipitated in 100 ml of petroleum ether. 80 mg of ionic polymer are obtained.

The band gap measured for copolymer 7 is equal to 2.02 eV.

EXAMPLE 8

The Preparation of the Statistical Copolymer 8

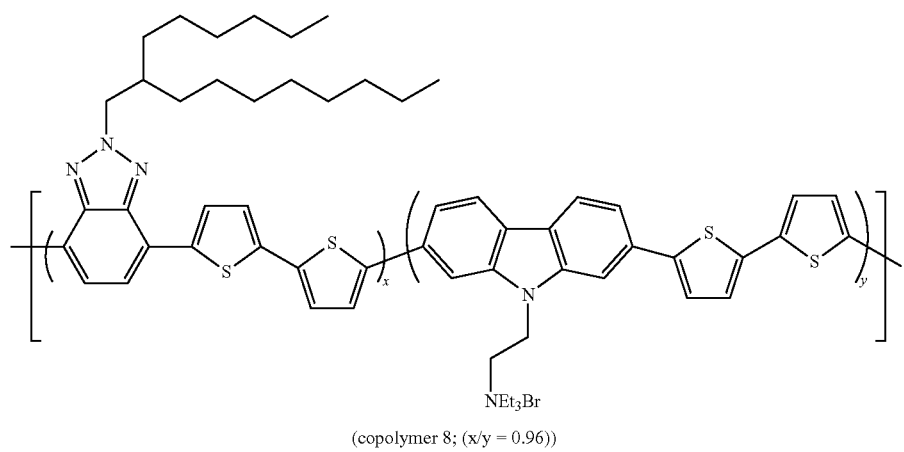

(copolymer 8; (x/y = 0.96))

is described hereunder.

200 mg of copolymer 6 are dissolved in 20 ml of THF. 1 ml of triethylamine are added to the solution. After 24 h of stirring at room temperature, the solution is concentrated to a tenth of the initial volume and precipitated in 100 ml of petroleum ether. 52 mg of ionic polymer are obtained.

The band gap measured for copolymer 8 is equal to 1.93 eV.

EXAMPLE 9

The Preparation of Copolymer 9

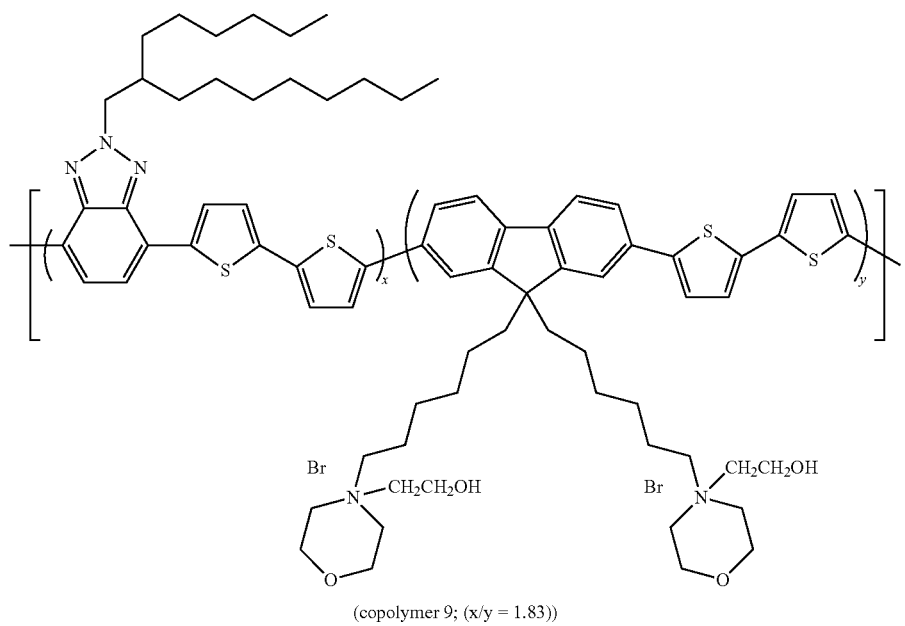

(copolymer 9; (x/y = 1.83))

is described hereunder.

200 mg of copolymer 6 are dissolved in 20 ml of THF. 2 ml of N-hydroxyethyl-morpholine are added to the solution. After 24 h of stirring at room temperature, the solution is concentrated to a tenth of the initial volume and precipitated in 100 ml of petroleum ether. 96 mg of ionic polymer are obtained.

The band gap measured for copolymer 9 is equal to 1.91 eV.

EXAMPLE 10

The Preparation of Copolymer 10

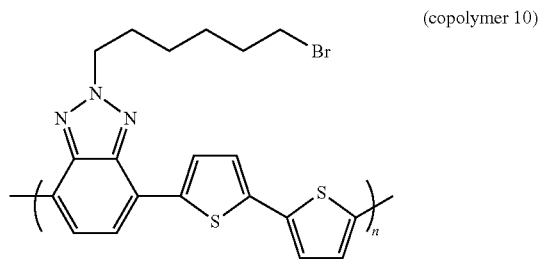

(copolymer 10)

is described hereunder.

The following products are introduced into a two-necked 250 ml flask equipped with a magnetic stirrer and reflux condenser, under an inert atmosphere:
  834.67 mg (1.91 mmoles) of 4,7-dibromo-N-(6-bromo-hexylhexyl)triazole,
  800 mg (1.91 mmoles) of 2,5-thiophenediboronic acid,
  4 ml of anhydrous EtOH,
  2 ml of a 4M solution of $K_2CO_3$,
  90 ml deaerated toluene.

The reaction mixture is heated to 90° C. for 15' and
220 mg (0.190 mmoles) of palladium (0) tetrakis(triphenylphosphine)
are subsequently added.

The reaction mixture is then heated to 100° C. and maintained at this temperature for 35 hours.

The reaction mixture is then concentrated to an eighth of its initial volume and poured into 300 ml of methanol. The solid obtained is filtered, re-dissolved in 20 ml of chloroform and re-precipitated in 300 ml of methanol. The polymer thus obtained is filtered and left to dry in an oven at 55° C. for 3 days. 553 mg of a black solid are obtained.

The band gap measured for copolymer 10 is equal to 1.95 eV.

EXAMPLE 11

The Preparation of Copolymer 11

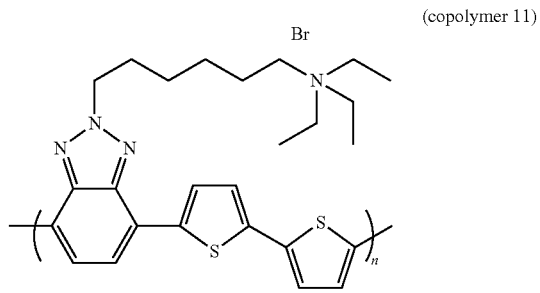

(copolymer 11)

is described hereunder.

300 mg (0.67 mmoles) of the polymer of Example 10 are dissolved in 25 ml of THF. 2 ml of triethylamine are added to the solution at 0° C. The temperature is left to rise to 30° C.

After 24 h of stirring, the solution is concentrated to a tenth of the initial volume and precipitated in 150 ml of petroleum ether. 257 mg of ionic polymer are obtained.

The band gap measured for copolymer 11 is equal to 1.93 eV.

Examples 1-11 show that the conjugated copolymers object of the present invention have band-gap energies of an entity which is compatible with their use in photovoltaic devices as electron-donor compounds.

Copolymers 1, 3 and 5-11, characterized by having, in the main chain, a conjugated unit with six members bonded to conjugated units with only five members, show lower band-gap energies and are therefore particularly suitable for the above use.

The invention claimed is:

1. An alternating or statistical conjugated copolymer comprising:

at least one benzotriazole unit B of formula (Ia) or (Ib):

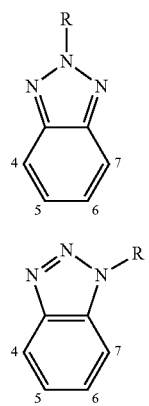

wherein R is selected from optionally substituted alkyl, aryl, acyl or thioacyl groups; and at least one conjugated structural unit A, wherein each unit B is connected to at least one unit A in any of the positions 4, 5, 6 or 7, and wherein the conjugated copolymer is selected from the group consisting of:

a copolymer of structure (1):

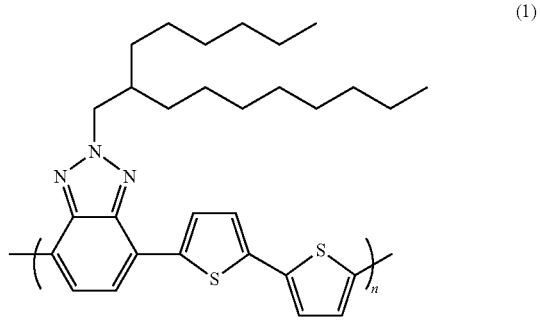

where n is a number from 5 to 1,000;

a copolymer of structure (2):

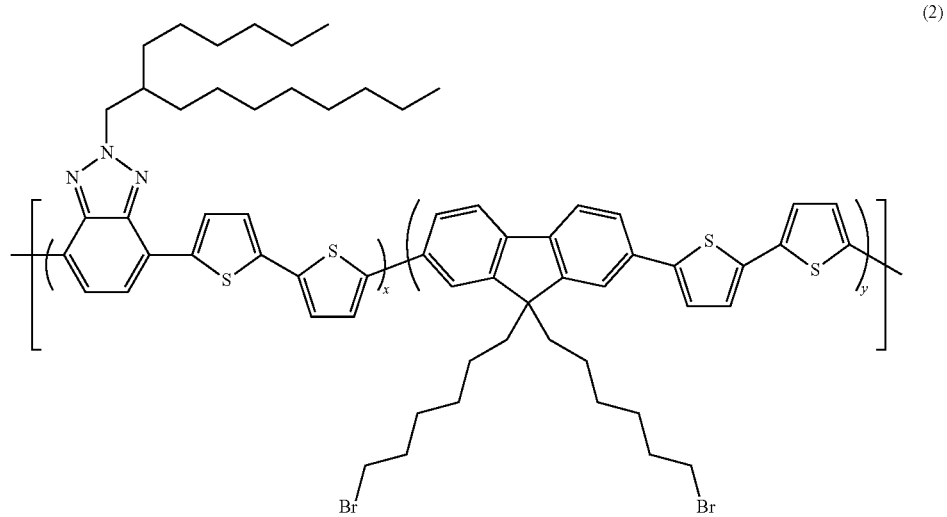

wherein x and y are two integers different from 0 such that the sum (x+y) is a number from 5-1,000;

a copolymer of formula (3):
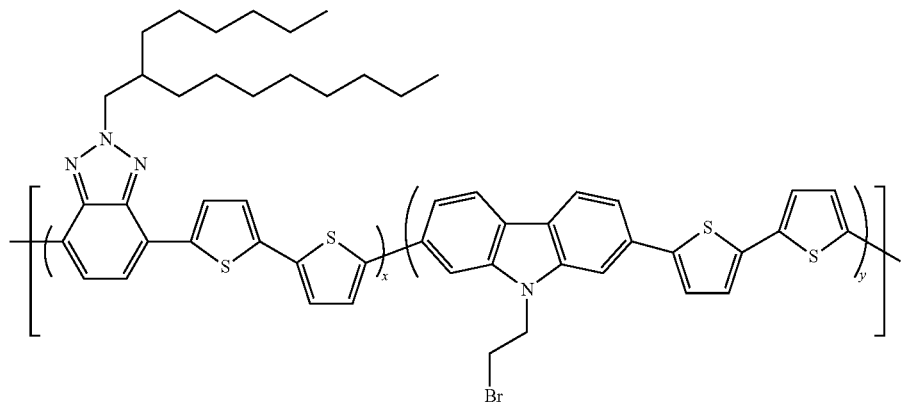
(3)
wherein x and y are two integers different from 0 such that the sum (x+y) is a number from 5-1,000;
a copolymer of structure (4):
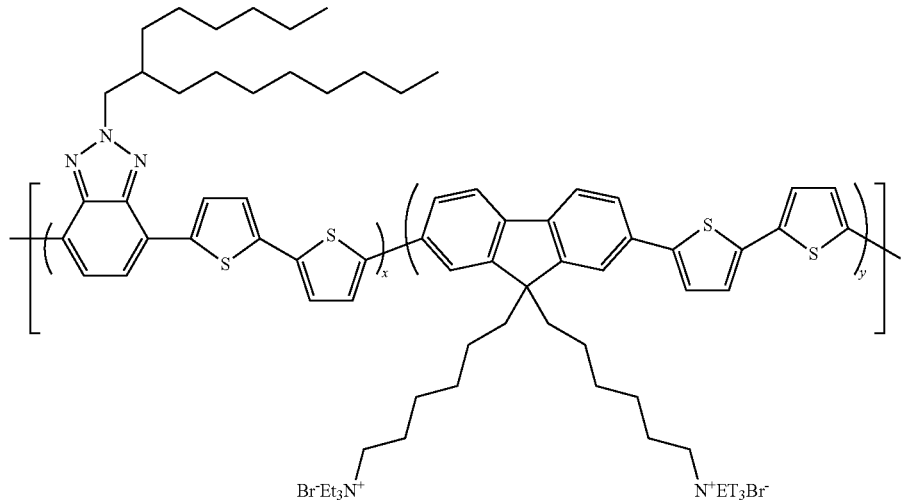
(4)
wherein x and y are two integers different from 0 such that the sum (x+y) is a number from 5-1,000;
a copolymer of structure (5):
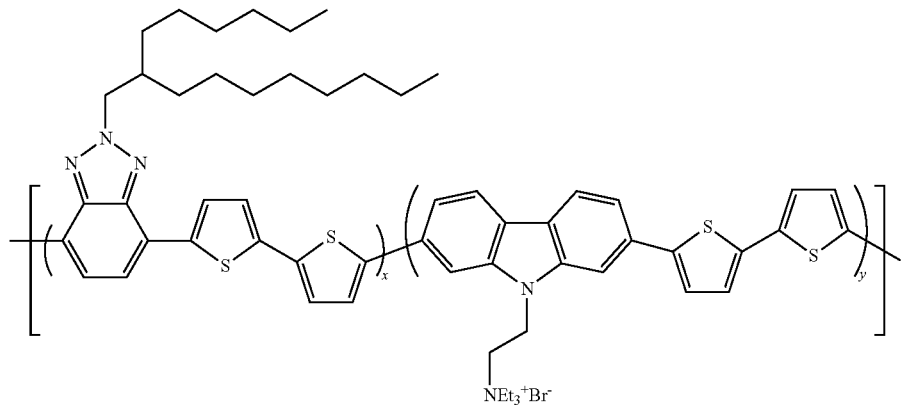
(5)
wherein x and y are two integers different from 0 such that the sum (x+y) is a number from 5-1,000;

a copolymer of structure (6):

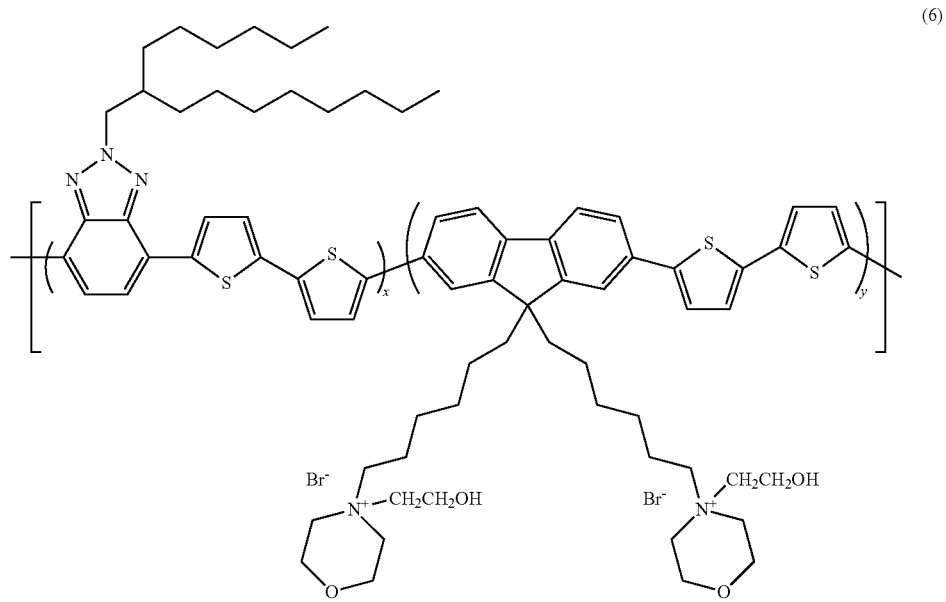

wherein x and y are two integers different from 0 such that the sum (x+y) is a number from 5-1,000; and
a copolymer of structure (7):

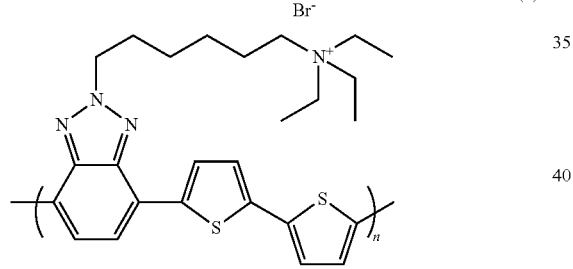

wherein n is an integer of 5-1,000.

2. A thin film, comprising a copolymer of claim 1, wherein a thickness of the copolymer film is from 0.05 μm to 0.5 μm.

3. A solar cell comprising a copolymer thin film according to claim 2.

4. A photovoltaic device comprising a copolymer according to claim 1.

* * * * *